(12) United States Patent
Pichler

(10) Patent No.: US 7,365,442 B2
(45) Date of Patent: Apr. 29, 2008

(54) ENCAPSULATION OF THIN-FILM ELECTRONIC DEVICES

(75) Inventor: Karl Pichler, Santa Clara, CA (US)

(73) Assignee: Osram Opto Semiconductors GmbH, Regensburg (DE)

( * ) Notice: Subject to any disclaimer, the term of this patent is extended or adjusted under 35 U.S.C. 154(b) by 82 days.

(21) Appl. No.: 10/403,565

(22) Filed: Mar. 31, 2003

(65) Prior Publication Data

US 2004/0191963 A1    Sep. 30, 2004

(51) Int. Cl.
  H01L 23/12     (2006.01)
  H01L 23/28     (2006.01)
  H01L 23/29     (2006.01)
  H01L 21/00     (2006.01)

(52) U.S. Cl. .................. 257/790; 257/704; 257/787; 438/106

(58) Field of Classification Search .................. 257/88, 257/95, 98, 99, 704, 730, 787, 790
See application file for complete search history.

(56) References Cited

U.S. PATENT DOCUMENTS

| | | | | |
|---|---|---|---|---|
| 5,239,228 A * | 8/1993 | Taniguchi et al. | ........... | 313/512 |
| 5,291,038 A * | 3/1994 | Hanamoto et al. | ............ | 257/82 |
| 5,336,931 A * | 8/1994 | Juskey et al. | ............... | 257/787 |
| 5,686,360 A | 11/1997 | Harvey, III et al. | ........ | 437/211 |
| 5,693,956 A | 12/1997 | Shi et al. | ...................... | 257/40 |
| 5,757,126 A | 5/1998 | Harvey, III et al. | ........ | 313/506 |
| 5,771,562 A | 6/1998 | Harvey, III et al. | ....... | 29/592.1 |
| 5,811,177 A | 9/1998 | Shi et al. | ..................... | 428/209 |
| 5,874,804 A | 2/1999 | Rogers | ........................ | 313/512 |
| 5,907,477 A * | 5/1999 | Tuttle et al. | ................. | 361/760 |
| 6,028,774 A * | 2/2000 | Shin et al. | ................... | 361/764 |
| 6,274,927 B1 * | 8/2001 | Glenn | ........................ | 257/680 |
| 6,428,650 B1 * | 8/2002 | Chung | ........................ | 156/250 |
| 6,441,481 B1 * | 8/2002 | Karpman | .................... | 257/711 |
| 6,470,594 B1 * | 10/2002 | Boroson et al. | .............. | 34/335 |
| 6,509,636 B1 * | 1/2003 | Tsai et al. | ................... | 257/678 |
| 6,525,405 B1 * | 2/2003 | Chun et al. | ................. | 257/666 |
| 6,545,332 B2 * | 4/2003 | Huang | ........................ | 257/433 |
| 6,566,745 B1 * | 5/2003 | Beyne et al. | ............... | 257/680 |
| 6,627,872 B1 * | 9/2003 | FuKamura et al. | ......... | 250/239 |
| 6,661,084 B1 * | 12/2003 | Peterson et al. | ............ | 257/680 |

(Continued)

FOREIGN PATENT DOCUMENTS

JP        353079469      *  7/1978

(Continued)

*Primary Examiner*—Carl Whitehead, Jr.
*Assistant Examiner*—James M Mitchell
(74) *Attorney, Agent, or Firm*—Fish & Richardson P.C.

(57) ABSTRACT

One embodiment of this invention pertains to multiple encapsulated thin-film electronic devices. These encapsulated devices include a substrate and multiple thin-film electronic devices are on this substrate. Each of the multiple thin-film electronic devices has an active area. The encapsulated devices also include an encapsulation layer that is on the substrate and this encapsulation layer has multiple holes and these multiple holes are over the active areas of the multiple thin-film electronic devices. The encapsulated devices also include multiple substantially flat encapsulation pieces that are on the encapsulation layer and these multiple substantially flat encapsulation pieces cover the multiple holes of the encapsulation layer. An absorbent material is not attached to any of the substantially flat encapsulation pieces.

39 Claims, 7 Drawing Sheets

U.S. PATENT DOCUMENTS

| | | | |
|---|---|---|---|
| 6,713,857 B1 * | 3/2004 | Tsai | 257/686 |
| 6,774,481 B2 * | 8/2004 | Ono | 257/704 |
| 6,900,531 B2 * | 5/2005 | Foong et al. | 257/687 |
| 7,002,241 B1 * | 2/2006 | Mostafazadeh et al. | 257/678 |
| 2002/0024131 A1 * | 2/2002 | Sasano | 257/704 |
| 2002/0027296 A1 * | 3/2002 | Badehi | 257/783 |
| 2003/0098912 A1 * | 5/2003 | Hosokai et al. | 348/207.99 |
| 2003/0124762 A1 * | 7/2003 | Hashimoto | 438/67 |
| 2004/0012698 A1 * | 1/2004 | Suda et al. | 348/315 |
| 2004/0038442 A1 * | 2/2004 | Kinsman | 438/64 |
| 2004/0124486 A1 * | 7/2004 | Yamamoto | 257/433 |

FOREIGN PATENT DOCUMENTS

| | | | |
|---|---|---|---|
| JP | 402020045 A * | 1/1990 | |
| JP | 402105443 A * | 4/1990 | |
| JP | 405055395 A * | 3/1993 | |
| JP | 2001068265 A | 3/2001 | |
| WO | 00/24126 | 4/2000 | |
| WO | 01/18886 | 3/2001 | |

* cited by examiner 103
(Prior Art)

153
(Prior Art)

ENCAPSULATION OF THIN-FILM ELECTRONIC DEVICES

BACKGROUND OF THE INVENTION

Thin-film electronic devices, such as organic light emitting diode ("OLED") displays, have to be encapsulated against the ingress of reactive materials such as oxygen and water to ensure good operating and storage lifetime. When manufacturing OLED displays, the encapsulation portion of this process should be fast and provide a high yield of displays that are reliable and cost effective. To minimize cost, typically, multiple OLED displays are fabricated on a single large substrate and after encapsulation, the substrate is singulated to produce individual encapsulated OLED displays. To increase yield and reduce cost, the number of OLED displays fabricated on the substrate is as large as possible. However, the tight spacing of the OLED displays on the substrate causes difficulties in the encapsulation process.

FIG. 1 shows prior art multiple encapsulated OLED displays on a single substrate 103. OLED displays 118, 121, 124, 127, 130, 133, 136, 139, 142 are all on a substrate 106. The OLED display 118 includes an active area 109 on the substrate 106. The active area 109 includes columns of electrodes and rows of electrodes. The rows of electrodes are perpendicular to the columns of electrodes. An organic layer is between the columns of electrodes and the rows of electrodes. OLED pixels are formed at the intersections of the columns of electrodes and the rows of electrodes. A perimeter seal glue 115 is deposited on the substrate 106 around the active area 109 so that an individual encapsulation lid 117 (e.g., a glass lid or a metal cap) can be glued to the substrate 106 in order to seal (e.g., encapsulate) the active area 109. The individual encapsulation lid 117 can contain a getter material in or on the lid. The getter material absorbs oxygen and/or moisture that is, for example, residual in the display package, or that, during display storage and operation, leaks through the perimeter seal glue 115 between the substrate 106 and the encapsulation lid 117. Conductive traces (not shown) are routed from the electrodes of the OLED display 118 to a contact pad 112. The contact pad 112 is used to couple the traces to a connector such as a flex connector. The connector is used, for example, to couple the display 103 to an external device such as a display driver (e.g., a row driver and a column driver). This encapsulation process of individually sealing each active area with a separate encapsulation lid is slow and costly. The precision needed to place each encapsulation lid over the active area, especially when the active areas are very close together, slows down the manufacturing process, reduces the yield because of unreliable displays due to not satisfying the increased precision needed, and increases the cost per display thus making this encapsulation process ineffective for mass producing multiple OLED displays.

An alternative technique is to encapsulate all of the active areas on the substrate at once by mating a cover sheet (e.g., the cover sheet can be a continuous sheet, i.e., foil) to the substrate where that encapsulation lid is the same size as the substrate. This alternative technique is shown in FIG. 2. FIG. 2 shows prior art multiple encapsulated OLED displays on a single substrate. OLED displays 156, 159, 162, 165, 168, 171, 174, 177, 180 are all on a substrate 154. The OLED display 118 includes an active area 183 on the substrate 154. A perimeter seal glue 189 is deposited on the substrate 154 around the active area 183. The perimeter seal glue is also deposited around the active areas of all of the other OLED displays. All of the active areas are encapsulated at once by mating a cover sheet that is the same size as the substrate 154 to the substrate 154 (the cover sheet is not shown in FIG. 2; the cover sheet can be, for example, a continuous sheet, i.e., foil). The mating occurs by pressing together the cover sheet and the substrate 154 and then curing the perimeter seal glue. After the cover sheet is mated with the substrate 154, the substrate 154 can be singulated along the singulation lines 192, 195, 198, 201, 204 by a scribe and break process, a cutting process, or a stamping process all of which are known in the prior art. The singulation of the substrate 154 yields individual OLED displays. Getter material can be attached to the cover sheet. Conductive traces (not shown) are routed from the electrodes of the OLED display 156 to a contact pad 186 that is used to couple the OLED display 156 to an external device.

This encapsulation process has several problems. One problem is that when the cover sheet and the substrate 154 are pressed together (this is typically done in inert atmosphere), the perimeter seal glue spreads and it becomes difficult to obtain a uniform bond line without bubbles, narrow openings, and meander structures. This difficulty is due, in part, to the pressure build-up between the cover sheet and the substrate 154 once both are close enough that the glue contacts them both but these two are further pressed together in hopes of producing a thin and uniform perimeter seal glue line around each active area. The pressure resulting from this further pressing together produces tiny openings or locally narrow sections in the perimeter seal glue line that then result in poorly encapsulated OLED displays. Some of the pressure building up on the perimeter seal glue is caused by gas pressure inside the areas enclosed by the perimeter seal glue between the substrate 154 and the cover sheet. Another problem is that the perimeter seal glue, upon being further pressed together, can spread over the singulation lines. This spreading of the glue over the singulation lines reduces encapsulation quality because, for example, an accurate scribe and break is more difficult and the yields are lower when the glue spreads over the singulation lines. The pressure between the substrate and the cover sheet are hard to control when mass producing multiple OLED displays thus resulting in poorly encapsulated displays due to perimeter seal glue lines that are nonuniform and have a thin width.

For the foregoing reasons, there exists a need to encapsulate thin-film electronic devices such that they can be quickly, reliably, and cost effectively mass produced while minimizing the reduction in encapsulation quality resulting from the high pressure applied to the perimeter seal glue.

SUMMARY

An embodiment of a method to encapsulate multiple thin-film electronic devices includes fabricating the multiple thin-film electronic devices on a substrate where each of the multiple thin-film electronic devices includes an active area. The method also includes mating an encapsulation layer to the substrate where that encapsulation layer includes multiple holes and those multiple holes are over the corresponding active areas of the multiple thin-film electronic devices. The method further includes not attaching an absorbent material to any of multiple substantially flat encapsulation pieces. The method includes mating the multiple substantially flat encapsulation pieces to the encapsulation layer where the multiple substantially flat encapsulation pieces cover the multiple holes of the encapsulation layer.

An embodiment of multiple encapsulated thin-film electronic devices includes a substrate, and multiple thin-film electronic devices on the substrate where each of the multiple thin-film electronic devices includes an active area. The electronic devices also include an encapsulation layer on the substrate where the encapsulation layer includes multiple holes and the multiple holes are over the corresponding active areas of the multiple thin-film electronic devices. The electronic devices further include multiple substantially flat encapsulation pieces on the encapsulation layer where the multiple substantially flat encapsulation pieces cover the multiple holes of the encapsulation layer and where an absorbent material is not attached to any of the multiple substantially flat encapsulation pieces.

DETAILED DESCRIPTION

One embodiment of this invention pertains to multiple encapsulated thin-film electronic devices. These encapsulated devices include a substrate and multiple thin-film electronic devices are on this substrate. Each of the multiple thin-film electronic devices has an active area. The encapsulated devices also include an encapsulation layer that is on the substrate and this encapsulation layer has multiple holes and these multiple holes are over the active areas of the multiple thin-film electronic devices. The encapsulated devices also include multiple substantially flat encapsulation pieces that are on the encapsulation layer and these multiple substantially flat encapsulation pieces cover the multiple holes of the encapsulation layer. An absorbent material is not attached to any of the substantially flat encapsulation pieces.

Other than OLED displays, other examples of electronic thin-film devices are: an active or passive matrix OLED light source, an active or passive matrix inorganic electroluminescent display, an organic or inorganic detector array, an organic or inorganic solar cell array, or an organic or inorganic thin-film transistor array. These devices are know in the art and are discussed in, for example: U.S. Pat. No. 5,733,381 entitled "Thin-Film Solar Cell Array and Method of Manufacturing Same"; U.S. Pat. No. 6,459,208 entitled "Active Matrix Electroluminescent Display Device"; and U.S. Pat. No. 6,211,534 entitled "Thin Film Transistor Array and Method for Fabricating the Same". All of these patents are incorporated by reference herein in their entirety. In order to provide specific examples, the remainder of this section refers to OLED displays, however, this invention can be used to encapsulate any thin-film electronic device.

Figure 1:
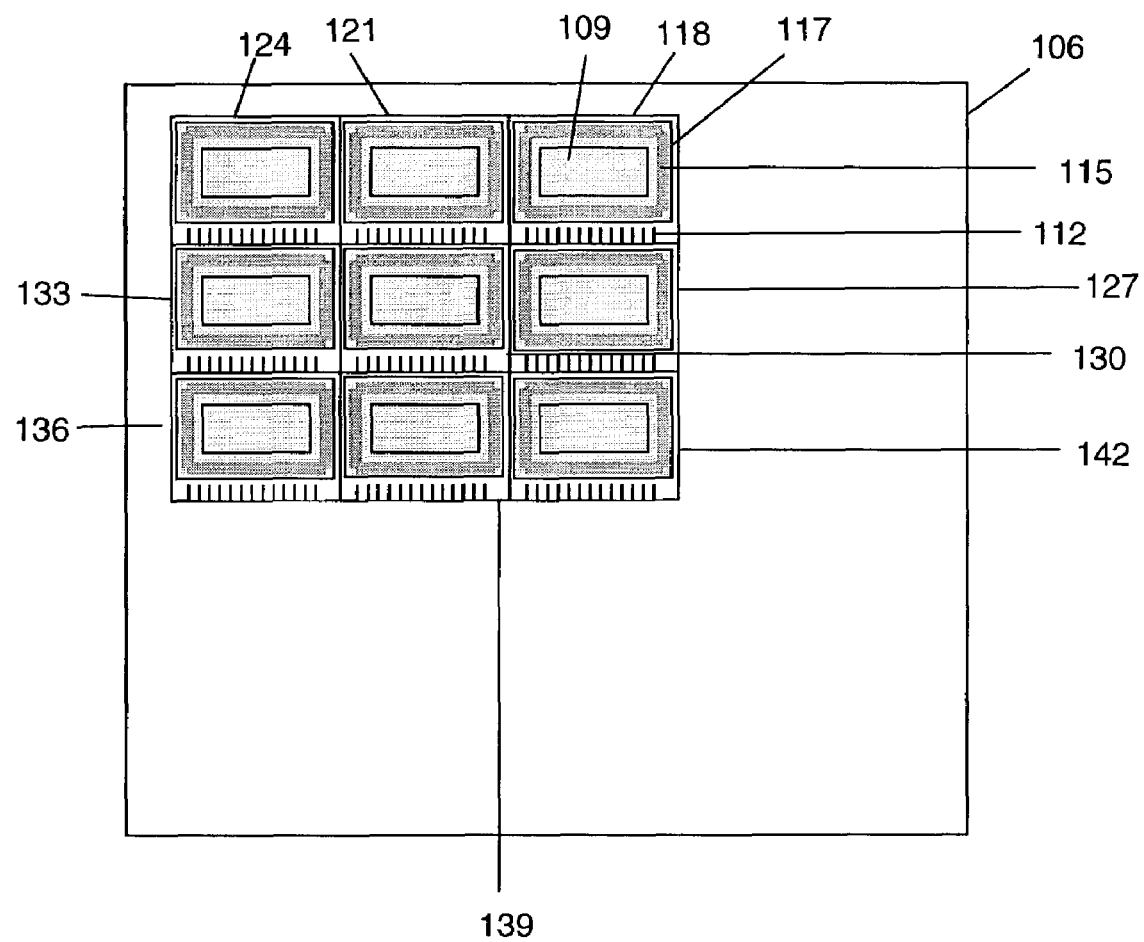
FIG. 1 shows prior art multiple encapsulated OLED displays on a single substrate.
Figure 2:
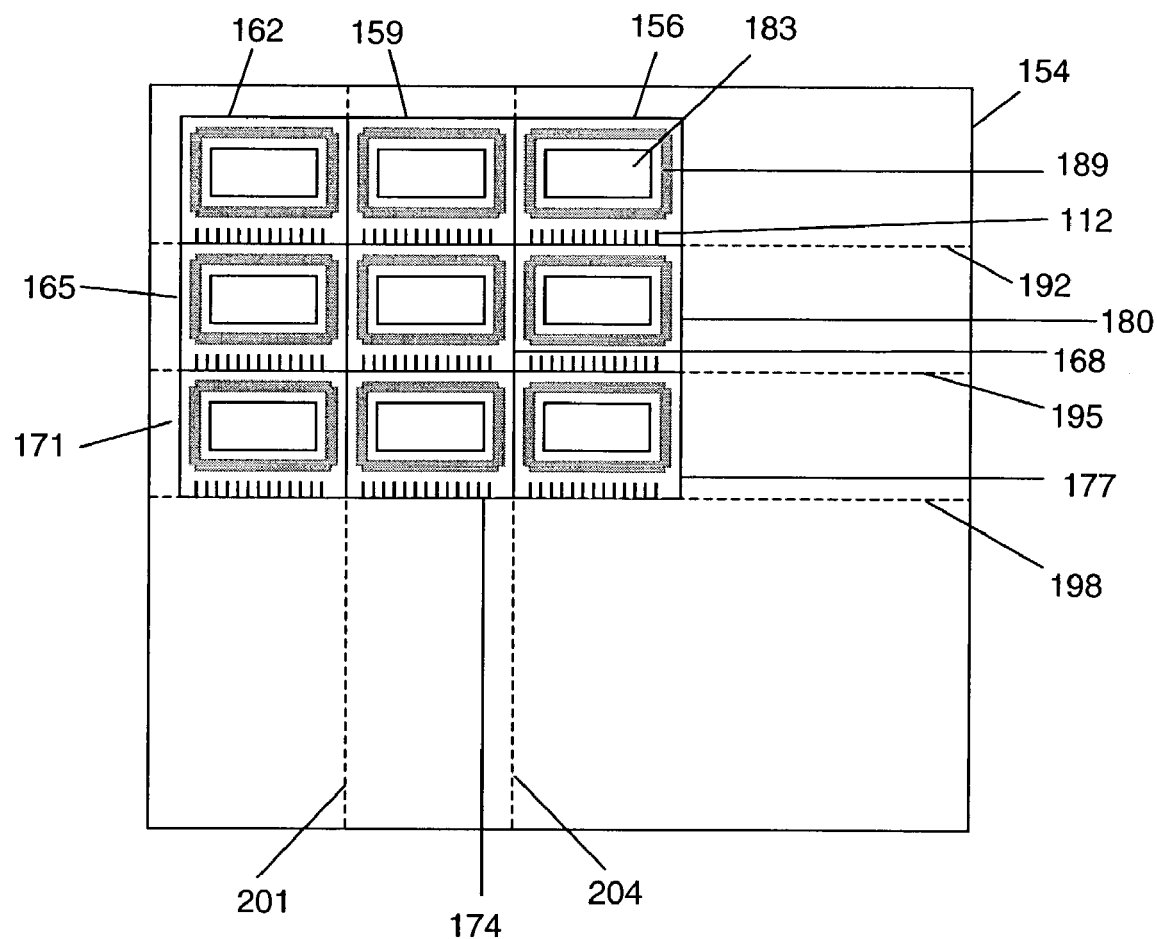
FIG. 2 shows another prior art multiple encapsulated OLED displays on a single substrate.
Figure 3:
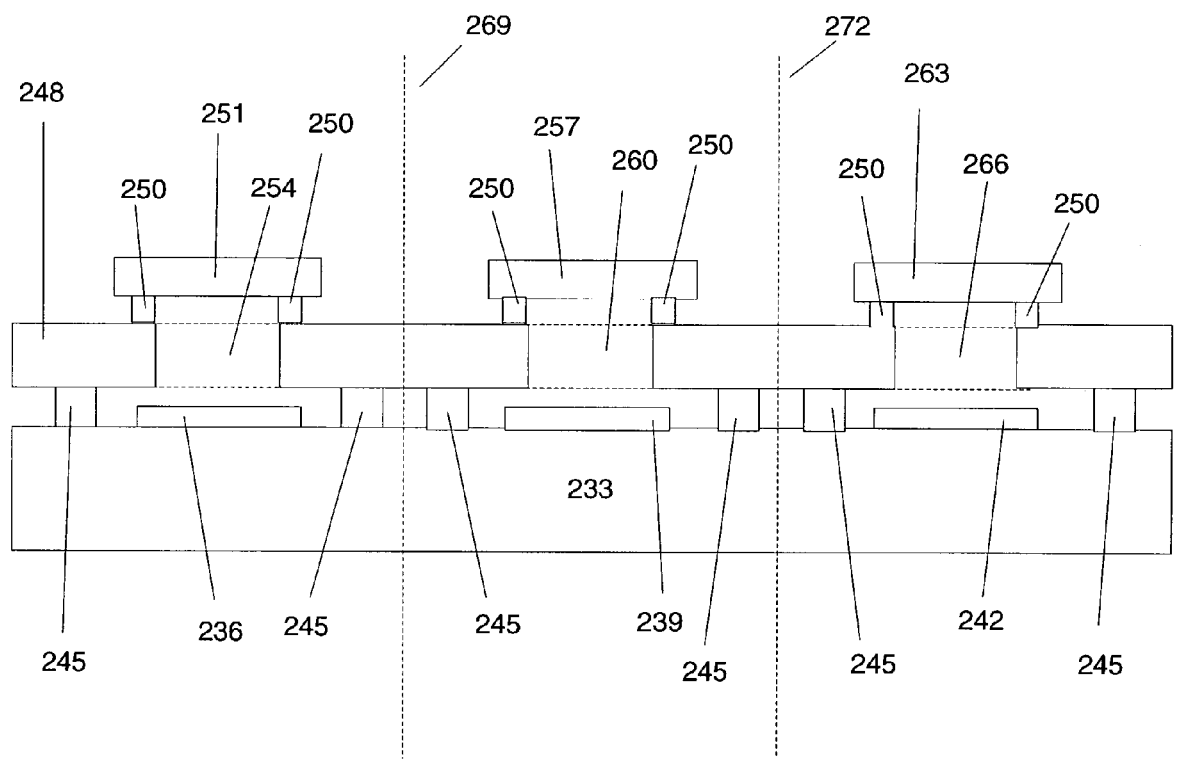
FIG. 3 shows a cross-sectional view of an embodiment of multiple encapsulated thin-film OLED displays according to the present invention.

FIG. 3 shows a cross-sectional view of an embodiment of multiple encapsulated thin-film OLED displays 230 according to the present invention. In FIG. 3, active areas 236, 239, 242 are fabricated on a substrate 233. As used within the specification and the claims, the term "on" includes when there is direct physical contact between the two parts and when there is indirect contact between the two parts because they are separated by one or more intervening parts. The substrate 233 can be, for example, a glass sheet or foil, a plastic sheet or foil, a quartz sheet or foil, a metal sheet or foil, a metalized plastic sheet or foil, a plastic sheet or foil with one or more dielectric barrier layers, or a silicon wafer. The dimensions of the substrate 233 are, for example, 400 by 400 millimeters or 730 by 920 millimeters. A perimeter seal glue 245 is deposited on the substrate 233 around the active areas 236, 239, 242. The perimeter seal glue 245 can be, for example, an epoxy material, a thermal-cure adhesive, a UV-cure adhesive, metal solder seals, or glass frits. The perimeter seal glue 245 can also include spacers. The glue can be deposited using printing techniques such as screen printing or dispensing techniques.

An encapsulation layer 248 is on the perimeter seal glue 245. The encapsulation layer 248 has multiple holes 254, 260, 266 and these holes are over the corresponding active areas 236, 239, 242. Alternatively, in another configuration of this embodiment, two or more holes are over a single active area. The holes 254, 260, 266 allow, for example, gas normally trapped in the cover sheet to escape thus reducing the pressure applied to the perimeter seal glue 245. Reducing the pressure inside the areas enclosed by the glue line due to openings in the encapsulation layer 248 minimizes the occurrence of tiny openings or locally narrow sections in the perimeter seal glue line that then result in poorly encapsulated OLED displays. The holes 254, 260, 266 allow the OLED displays to be manufactured faster and/or with higher yield and/or with a wider choice of glue materials and glue deposition techniques and/or wider choice and wider tolerance for the encapsulation process since less consideration has to be given to the effects of the internal pressure on the perimeter seal glue 245. The holes 254, 260, 266 in the encapsulation layer 248 can have any shape such as, for example, a rectangular shape, a square shape, a circular shape, an elliptical shape, or a diamond shape. The holes in the encapsulation layer 248 may have the same shape or alternatively, may have different shapes. For, example, the hole 254 and the hole 260 may both have a rectangular shape or alternatively, the hole 254 may have a rectangular shape while the hole 260 has a square shape. The shape of the holes in one encapsulation layer on one display can vary from the shape of the holes in another encapsulation layer on another display. The encapsulation layer 248 can be made of the same materials as the substrate 233. The range of thickness of the encapsulation layer 248 is typically from about 10 micrometers to 5 millimeters, preferably is from about 0.1 millimeters to 1.0 millimeters. The holes 254, 260, 266 in the encapsulation layer 248 can be produced by, for example, etching, stamping, cutting, laser cutting, sand blasting, and water jet cutting.

A perimeter seal glue 250 is deposited around the holes 254, 260, 266. Substantially flat encapsulation pieces 251, 257, 263 are on the perimeter seal glue 250 in order to cover the corresponding holes 254, 260, 266 of the encapsulation layer 248. Alternatively, the perimeter seal glue 250 can be deposited on the substantially flat encapsulation pieces 251, 257, 263 such that the pieces 251, 257, 263 cover the corresponding holes when the encapsulation pieces are mated to the encapsulation layer 248. The perimeter seal glue can be applied all over to the top of the encapsulation layer 248 or to the bottom of the encapsulation pieces 251, 257, 263. The substantially flat encapsulation pieces 251, 257, 263 can be, for example, metal foils, or pieces of metal, glass, thin flexible glass, plastic, and plastic with one or more barrier films where the barrier films are dielectric films and/or metal films and/or alloy films. The range of thickness of each of the substantially flat encapsulation pieces 251, 257, 263 is typically from about 10 micrometers to 5 millimeters, preferably is from about 0.1 millimeters to 1.0 millimeters. The substantially flat encapsulation pieces 251, 257, 263 can be mated with the encapsulation layer 248 relatively quickly since, for example, perimeter seal glue placement and perimeter seal glue uniformity are less stringent when mating these pieces to the encapsulation layer 248 than when mating the cover sheet with the substrate. The substantially flat encapsulation pieces 251, 257, 263 can be mated to the encapsulation layer 248 with, for example, a pressure bag, clamps, stamp, pressure plate, and a roller under pressure and/or heat. In this embodiment, no getter material is attached to the substantially flat encapsulation pieces 251, 257, 263.

Singulation occurs at singulation lines 269, 272 resulting in three separate displays. The substrate 233 may be singulated before or after the substantially flat encapsulation pieces 251, 257, 263 are deposited on the encapsulation layer 248 to cover the holes 254, 260, 266. In one configuration of this embodiment, the length of each of the substantially flat encapsulation pieces 251, 257, 263 is smaller than the length of the substrate of a singulated OLED display, and the length of the pieces are large enough to cover the corresponding holes 254, 260, 266. Because the displays on the substrate 233 are typically close to each other while a hole in the encapsulation layer 248 typically has a diameter much smaller than the length of the corresponding display, the tolerances for the perimeter seal glue 250 is greater than the tolerances for the perimeter seal 245. Since the tolerances for the perimeter seal glue 250 is greater than the tolerances for the perimeter seal glue 245, the precision used to mate the encapsulation pieces 251, 257, 263 to the encapsulation layer 248 is less than that used to mate the encapsulation layer 248 to the substrate 233, therefore, the encapsulation pieces 251, 257, 263 can be mated faster.

The holes 254, 260, 266 can be filled with an absorbent material that can be used to absorb, for example, oxygen and/or water. The term "filled" as used within the specification and the claims includes, for example, attaching the absorbent material to the holes, gluing the absorbent material into the holes, placing the absorbent materials into the holes, printing the absorbent materials into the holes, laminating the absorbent material into the holes, dispensing the absorbent materials into the holes, pressing the absorbent materials into the holes, and injecting the absorbent materials into the holes. The getter material can be, for example, a reactive metal, a reactive metal oxide, a zeolite, a getter paste, a getter foil, a getter liquid, a getter film, a getter powder, or a getter tablet. Examples of the reactive metal include barium and calcium and examples of the reactive metal oxide include barium oxide and calcium oxide. The holes 254, 260, 266 are typically filled with the absorbent material prior to mating the substantially flat encapsulation pieces 251, 257, 263 with the encapsulation layer 248.

In one configuration of this embodiment, the perimeter seal glue 250 is wider and/or has lower oxygen and water permeability than the perimeter seal glue 245 to ensure that ingress of oxygen and water through the perimeter seal glue 250 is less than through the perimeter seal glue 245. Alternatively, the perimeter seal glue 250 may have the same or less width and/or permeability than the perimeter seal glue 245.

Prior to mating the encapsulation layer 248, to the substrate 233, a thin-film encapsulation layer can be selectively deposited on the active areas 236, 239, 242 to cover and protect these active areas. The thickness of the thin-film encapsulation layer, for example, less than about 200 micrometers thick, preferably less than about 100 micrometers thick, more preferably less than about 50 micrometers thick. Thin-film encapsulation is described in the U.S. patent application entitled "Encapsulation for Organic Light Emitting Diodes Devices" having the application Ser. No. 10/137,163 and filed on May 2, 2002. Thin-film encapsulation is also described in the U.S. patent application entitled "Improved Encapsulation for Organic Electronic Devices" having the application Ser. No. 10/300,161 and filed on Nov. 20, 2002. Both of these applications are incorporated by reference herein in their entirety.

Prior to mating the substantially flat encapsulation pieces 251, 257, 263 to the encapsulation layer 248, a thin protective layer can be deposited on the active areas 236, 239, 242 to cover and protect the active areas 236, 239, 242. The thin protective layer can be, for example, a thin piece of foil or paste.

Figure 4:
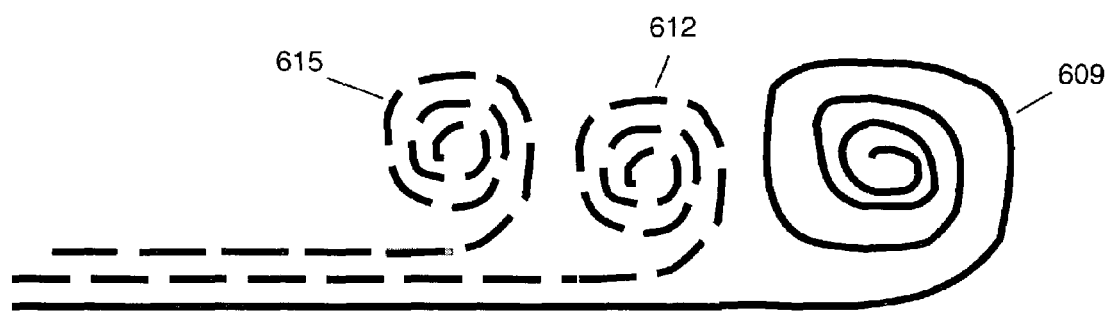
FIG. 4 shows encapsulating the OLED displays using continuous foils.

The substrate 233, the encapsulation layer 248, and the substantially flat encapsulation pieces 251, 257, 263 can each be a separate sheet or on rolls. The encapsulation described herein can be applied using a sheet-based process or a roll-to-roll-based process. FIG. 4 shows encapsulating the displays using continuous foils. In FIG. 4, the substrate is a roll 609, the encapsulation layer is a roll 612, and the substantially flat encapsulation pieces are on a roll 615. The rolls 609, 612, 615 are, for example, rolled onto or laminated to each other. The active areas (not shown) are on the roll 609. The perimeter seal glue can be deposited on the bottom of the roll 612 or the top of the roll 609 to mate the roll 612 with the roll 609. The perimeter seal glue can be deposited on the top of the roll 612 or the bottom of the roll 615 to mate the roll 615 with the roll 612. Also, the perimeter seal glue can be applied all over the bottom of the roll 615 or the top of the roll 612. The roll 615, the roll 612, and the roll 609 are singulated (e.g., cut or stamped) together resulting in separate displays.

Figure 5:
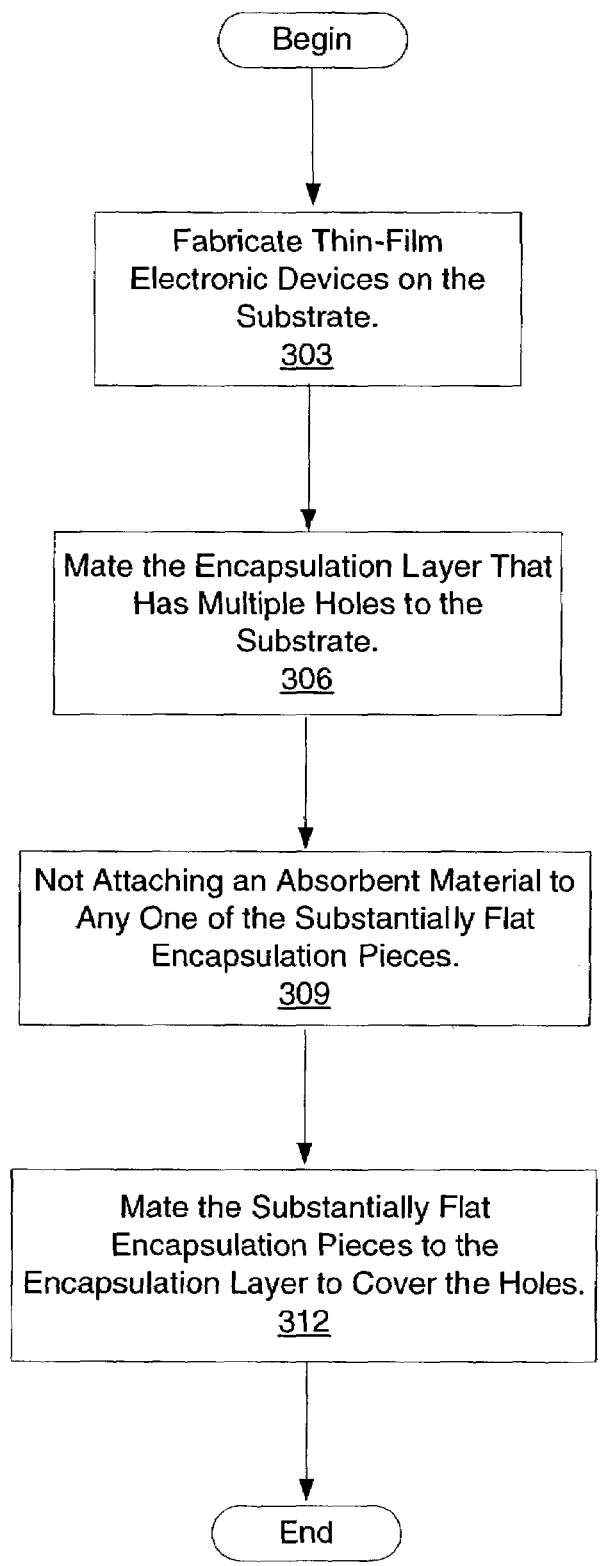
FIG. 5 shows an embodiment of a process to encapsulate multiple thin-film electronic devices according to the present invention.

FIG. 5 shows an embodiment of a process to encapsulate multiple thin-film electronic devices according to the present invention. In block 303, thin-film electronic devices are fabricated on the substrate 233. Each of the thin-film electronic devices has an active area. The perimeter seal glue 245 is deposited around each of the active areas 236, 239, 242. In block 306, the encapsulation layer 248 is mated to the substrate 233. The encapsulation layer 248 has holes 254, 260, 266 and these holes are over the corresponding active areas 236, 239, 242. The perimeter seal glue 250 is deposited around the holes 254, 260, 266. In block 309, an absorbent material is not attached to any one of the substantially flat encapsulation pieces 251, 257, 263. In block 312, the substantially flat encapsulation pieces 251, 257, 263 are mated to the encapsulation layer 248 so as to cover the holes 254, 260, 266.

Prior to mating the substantially flat encapsulation pieces 251, 257, 263 to the encapsulation layer 248, the holes 254, 260, 266 can be filled with an absorbent material. Also, prior to mating the encapsulation layer 248 to the substrate 233, a thin-film encapsulation layer can be selectively deposited on each of the active areas 236, 239, 242 to cover these active areas. Prior to mating the substantially flat encapsulation pieces 251, 257, 263 to the encapsulation layer 248, a thin protective layer can be deposited on each of the active areas 236, 239, 242 to cover them. Also, the substrate 233 can be singulated to produce individual thin-film electronic devices before or after mating the substantially flat encapsulation pieces 251, 257, 263 to the encapsulation layer 248.

Figure 6:
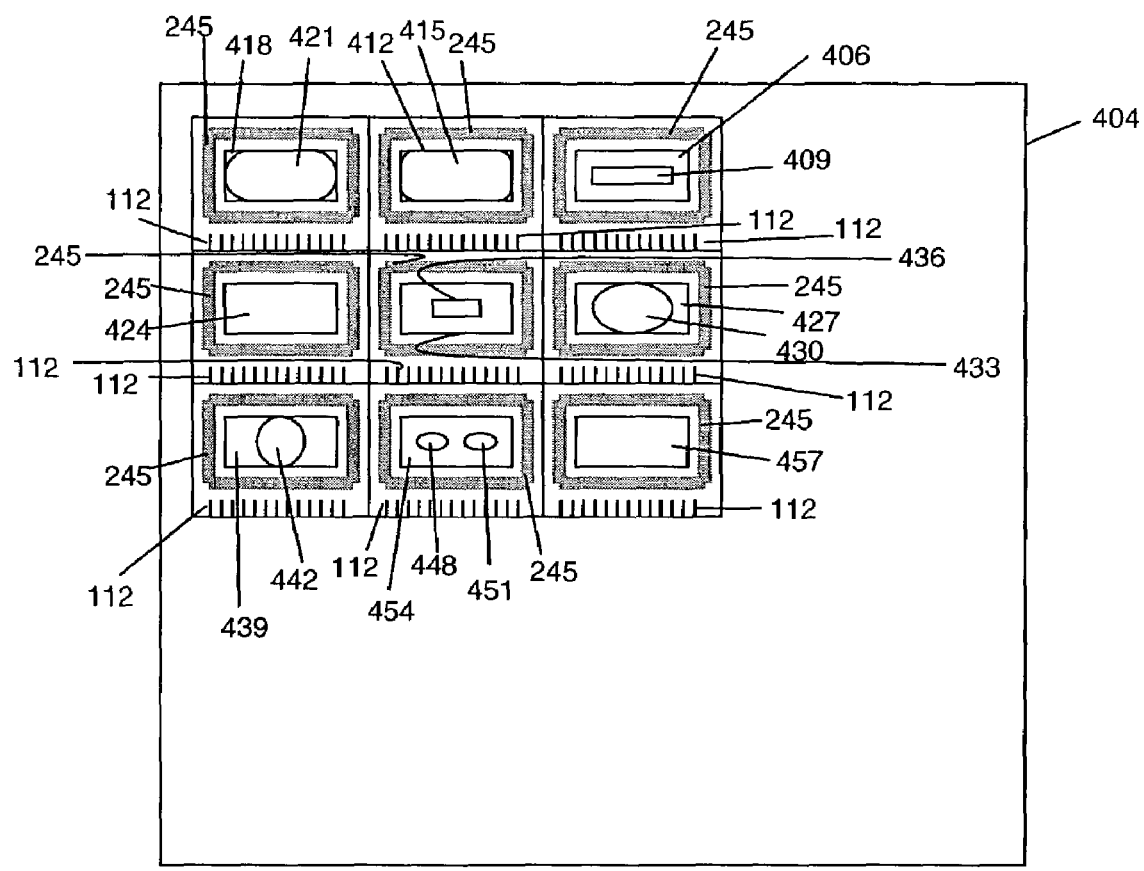
FIG. 6 shows a top view of an embodiment of multiple encapsulated OLED displays according to the present invention.

FIG. 6 shows a top view of an embodiment of multiple encapsulated OLED displays 403 according to the present invention. In FIG. 6, active areas 406, 412, 418, 424, 427, 433, 439, 454, 457 of the OLED displays are fabricated on the substrate 404. The perimeter glue seal 245 is deposited around each of the active areas 406, 412, 418, 424, 427, 433, 439, 454, 457. In FIG. 6, the holes in the encapsulation layers are over the corresponding active areas and these holes have different shapes. For example, holes 409, 436 have a rectangular shape; holes 415, 421, 430 have an elliptical shape; and hole 442 has a circular shape. Also, two or more holes may be over a single active area. For example, hole 448 and hole 451 are over the active area 454. Contact pads 112 are used to connect the OLED displays to external devices.

Figure 7:
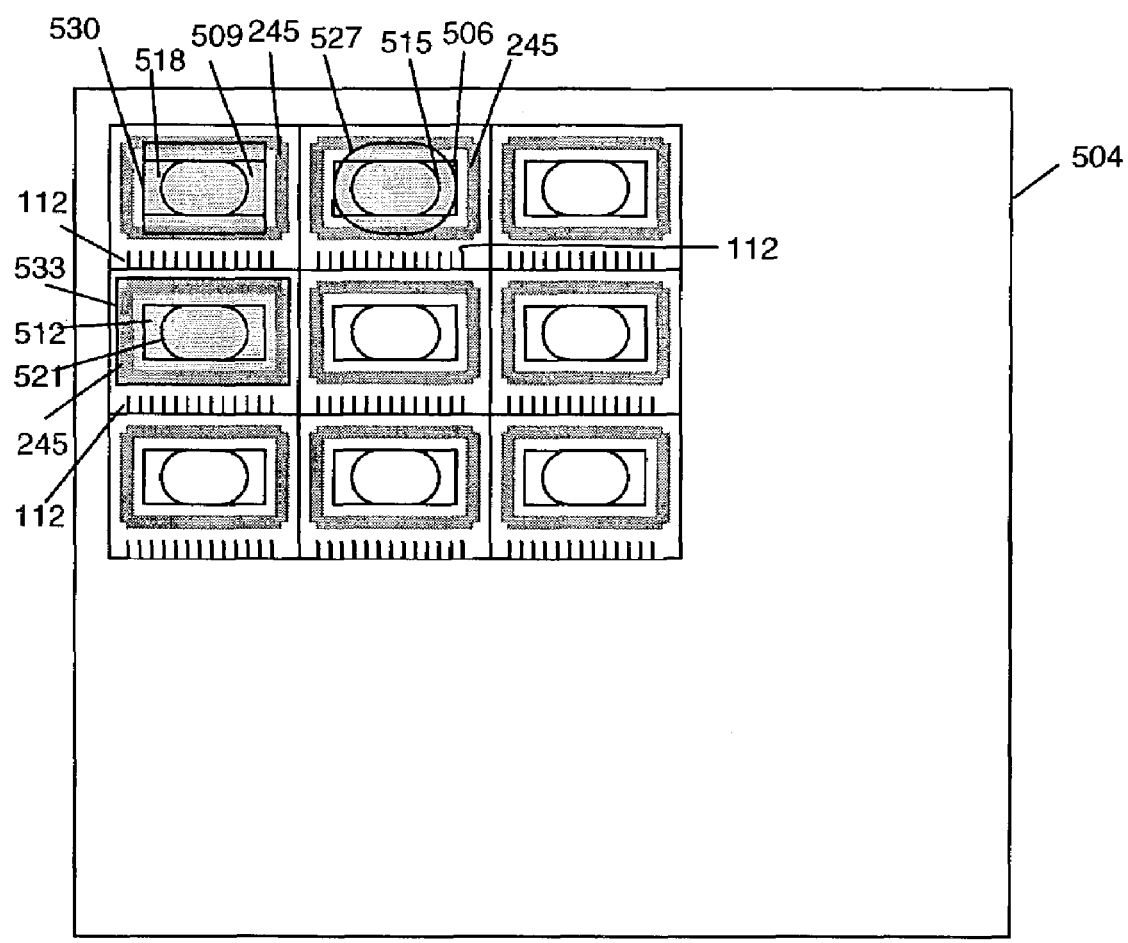
FIG. 7 shows another top view of an embodiment of multiple encapsulated OLED displays according to the present invention.

FIG. 7 shows another top view of an embodiment of multiple encapsulated OLED displays 503 according to the present invention. In FIG. 7, active areas 506, 509, 512 of the OLED displays are fabricated on the substrate 504. The perimeter glue seal 245 is deposited around each of the active areas 506, 509, 512. The holes 515, 518, 521 in the encapsulation layers are over the corresponding active areas 506, 509, 512. In FIG. 7, the substantially flat encapsulation pieces 527, 530, 533 have different, shapes. For example, piece 527 has an elliptical shape and pieces 530, 533 have a rectangular shape. Contact pads 112 are used to connect the OLED displays to external devices.

As any person of ordinary skill in the art of electronic thin-film device fabrication and encapsulation will recognize from the description, figures, and examples that modifications and changes can be made to the embodiments of the invention without departing from the scope of the invention defined by the following claims.

What is claimed:

1. An encapsulated thin-film electronic device, comprising:
    a substrate;
    a plurality of thin-film electronic devices on said substrate, wherein each of said plurality of thin-film electronic devices includes an active area;
    an encapsulation layer including a plurality of holes over said active areas of said plurality of thin-film electronic devices;
    a plurality of first perimeter seal glue lines around said plurality of holes;
    a plurality of flat encapsulation pieces on said plurality of first perimeter seal glue lines, wherein said plurality of first perimeter seal glue lines mates said plurality of flat encapsulation pieces to said encapsulation layer; and
    a plurality of second perimeter seal glue lines around said plurality of thin-film electronic devices, wherein said plurality of second perimeter seal glue lines mates said encapsulation layer to said substrate, wherein
    an absorbent material is not attached to said flat encapsulation pieces;
    said plurality of first perimeter seal glue lines has lower oxygen and water permeability than said plurality of second perimeter seal glue lines; and
    said plurality of first perimeter seal glue lines is wider than said plurality of second perimeter seal glue lines.

2. The device of claim 1, further comprising a thin protective layer that covers each of said active areas of said plurality of thin-film electronic devices.

3. The device of claim 1, further comprising a thin-film encapsulation layer on each of said active areas of said plurality of thin-film electronic devices, wherein said thin-film encapsulation layer is selectively deposited and covers each of said active areas.

4. The device of claim 1, wherein said plurality of thin-film electronic devices are any one of: active matrix OLED displays, passive matrix OLED displays, OLED light sources, active matrix inorganic electroluminescent displays, passive matrix inorganic electroluminescent displays, organic light detector arrays, inorganic light detector arrays, organic solar cell arrays, inorganic solar cell arrays, organic thin-film transistor arrays, or inorganic thin-film transistor arrays.

5. The device of claim 1, wherein there is a plurality of holes over each of said active areas.

6. The device of claim 1, wherein two or more of said plurality of holes are over said active areas.

7. The device of claim 1, wherein a particular one of said plurality of holes is directly over said active area of a corresponding one of said plurality of thin-film electronic devices.

8. The device of claim 1, wherein said holes are filled with an absorbent material.

9. The device of claim 1, wherein the encapsulation layer comprises a glass sheet or foil.

10. The device of claim 1, wherein the first perimeter seal glue line separates the flat encapsulation piece from the encapsulation layer.

11. A method of forming the device of claim 1, comprising:
    fabricating said plurality of thin-film electronic devices on said substrate;
    mating said encapsulation layer to the substrate when the holes of the encapsulation layer are over said active areas of the plurality of thin-film electronic devices; and
    mating the plurality of substantially flat encapsulation pieces to the encapsulation layer to cover said plurality of holes of said encapsulation layer.

12. The method of claim 11, further comprising prior to mating said plurality of substantially flat encapsulation pieces to the encapsulation layer, filling each of the plurality of holes of said encapsulation layer with said absorbent material.

13. The method of claim 12, further comprising prior to filling each of said plurality of holes of said encapsulation layer with said absorbent material, depositing a thin protective layer on each of said active areas of said plurality of thin-film electronic devices to cover each of said active areas.

14. The method of claim 12, wherein said absorbent material is any one of: a reactive metal, a reactive metal oxide, a zeolite, a getter paste, a getter foil, a getter liquid, a getter film, a getter powder, or a getter tablet.

15. The method of claim 14, wherein said reactive metal is any one of: barium or calcium; and said reactive metal oxide is any one of: barium oxide or calcium oxide.

16. The method of claim 11, further comprising prior to mating said encapsulation layer to said substrate, selectively depositing a thin-film encapsulation layer on each of said active areas of said plurality of thin-film electronic devices to cover each of said active areas.

17. The method of claim 11, further comprising prior to mating said plurality of substantially flat encapsulation pieces to said encapsulation layer, singulating said substrate to produce a plurality of individual thin-film electronic devices.

18. The method of claim 17, wherein a length of a particular one of said plurality of substantially flat encapsulation pieces is smaller than a length of a substrate of a corresponding one of said plurality of individual thin-film electronic devices.

19. The method of claim 11, further comprising after mating said plurality of substantially flat encapsulation pieces to said encapsulation layer, singulating said substrate to produce a plurality of individual thin-film electronic devices.

20. The method of claim 19, wherein a length of a particular one of said plurality of substantially flat encapsulation pieces is smaller than a length of a substrate of a corresponding one of said plurality of individual thin-film electronic devices.

21. The method of claim 11, wherein said substrate is a roll, said encapsulation layer is a roll, and said plurality of substantially flat encapsulation pieces are on a roll and the encapsulation is performed using a roll-to-roll based process.

22. The method of claim 11, wherein said plurality of thin-film electronic devices are any one of: active matrix OLED displays, passive matrix OLED displays, OLED light sources, active matrix inorganic electroluminescent displays, passive matrix inorganic electroluminescent displays, organic light detector arrays, inorganic light detector arrays, organic solar cell arrays, inorganic solar cell arrays, organic thin-film transistor arrays, or inorganic thin-film transistor arrays.

23. The method of claim 11, wherein only one of said plurality of holes is over a particular one of said active areas.

24. An encapsulated thin-film electronic device, comprising:
   a substrate;
   a thin-film electronic device on said substrate, wherein the thin-film electronic device includes an active area;
   an encapsulation layer on said substrate, wherein said encapsulation layer includes at least one hole and said hole is over said active area of said thin-film electronic device;
   a first perimeter seal glue line around said hole;
   a second perimeter seal glue line around said thin-film electronic device, wherein said second perimeter seal glue line mates said encapsulation layer to said substrate; and
   a flat encapsulation piece on said first perimeter seal glue line, said first perimeter seal glue line mates said flat encapsulation piece to said encapsulation layer,
   wherein an absorbent material is not attached to said flat encapsulation piece,
   said first perimeter seal glue line has lower oxygen and water permeability than said second perimeter seal glue line, and
   said first perimeter seal glue line is wider than said second perimeter seal glue line.

25. The device of claim 24, further comprising a thin protective layer that covers said active area of said thin-film electronic device.

26. The device of claim 24, further comprising a thin-film encapsulation layer on said active area of said thin-film electronic device, wherein said thin-film encapsulation layer is selectively deposited and covers said active area.

27. The device of claim 24, wherein said encapsulation layer is a roll, and said flat encapsulation piece is on a roll and said thin-film electronic device is encapsulated using a roll-to-roll based process.

28. The device of claim 24, wherein said thin-film electronic device is any one of: an active matrix OLED display, a passive matrix OLED display, an OLED light source, an active matrix inorganic electroluminescent display, a passive matrix inorganic electroluminescent display, an organic light detector, an inorganic light detector, an organic solar cell, an inorganic solar cell, an organic thin-film transistor, or an inorganic thin-film transistor.

29. The device of claim 24, wherein there is a plurality of holes over said active area.

30. The device of claim 29 wherein two or moe of said plurality of holes are over said active area.

31. The device of claim 24, wherein said hole is directly over said active area of said thin-film electronic device.

32. The device of claim 24, wherein the hole is filled with an absorbent material.

33. The device of claim 24, wherein the flat encapsulation piece comprises a metal, glass, plastic, or plastic with one or more barrier films.

34. The device of claim 1, wherein the flat encapsulation pieces comprise a metal, glass, plastic, or plastic with one or more barrier films.

35. The device of claim 24, wherein the encapsulation layer comprises a glass sheet or foil.

36. The device of claim 24, wherein the first perimeter seal glue line separates the flat encapsulation piece from the encapsulation layer.

37. The device of claim 24, further comprising an absorbent material that fills said hole of said encapsulation layer.

38. The device of claim 37, wherein said absorbent material is any one of: a reactive metal, a reactive metal oxide, a zeolite, a getter paste, a getter foil, a getter liquid, a getter film, a getter powder, or a getter tablet.

39. The device of claim 38, wherein said reactive metal is any one of: barium or calcium; and said reactive metal oxide is any one of: barium oxide or calcium oxide.

* * * * *

UNITED STATES PATENT AND TRADEMARK OFFICE
CERTIFICATE OF CORRECTION

PATENT NO. : 7,365,442 B2 Page 1 of 1
APPLICATION NO. : 10/403565
DATED : April 29, 2008
INVENTOR(S) : Karl Pichler It is certified that error appears in the above-identified patent and that said Letters Patent is hereby corrected as shown below:

Column 10, Line 28 at Claim 30; replace:
    "The device of claim 29 wherein two or moe of said" with
    -- The device of claim 29 wherein two or more of said --

Signed and Sealed this

Twenty-ninth Day of July, 2008

JON W. DUDAS
*Director of the United States Patent and Trademark Office*